(12) United States Patent
Gailhard et al.

(10) Patent No.: US 11,245,405 B2
(45) Date of Patent: Feb. 8, 2022

(54) PROCESS FOR MANAGING THE START-UP OF A PHASE-LOCKED LOOP, AND CORRESPONDING INTEGRATED CIRCUIT

(71) Applicant: STMicroelectronics (Rousset) SAS, Rousset (FR)

(72) Inventors: Bruno Gailhard, Peypin (FR); Laurent Truphemus, Pourrieres (FR); Christophe Eva, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 17/352,849

(22) Filed: Jun. 21, 2021

(65) Prior Publication Data
US 2021/0409030 A1  Dec. 30, 2021

(30) Foreign Application Priority Data
Jun. 24, 2020  (FR) ..................... 2006639

(51) Int. Cl.
*H03L 7/10*  (2006.01)
*H03L 7/099*  (2006.01)
*H03L 7/089*  (2006.01)

(52) U.S. Cl.
CPC .............. *H03L 7/10* (2013.01); *H03L 7/0891* (2013.01); *H03L 7/099* (2013.01)

(58) Field of Classification Search
CPC .......... H03L 7/10; H03L 7/0891; H03L 7/099
See application file for complete search history.

(56) References Cited

U.S. PATENT DOCUMENTS

| 5,898,328 | A |   | 4/1999 | Shoji |
| 5,963,068 | A | * | 10/1999 | Hardesty ............... G06F 1/08 327/156 |
| 6,549,079 | B1 |   | 4/2003 | Crook |
| 8,432,204 | B1 | * | 4/2013 | Chern ................ H03L 7/102 327/157 |
| 8,723,567 | B1 | * | 5/2014 | Dang ................ H03H 11/1269 327/157 |
| 10,763,871 | B1 | * | 9/2020 | Patasani ............. H03C 3/0941 |
| 10,833,684 | B1 | * | 11/2020 | Bhagwan ............. H03L 7/093 |
| 2006/0158263 | A1 |   | 7/2006 | Goldberg |
| 2006/0267640 | A1 | * | 11/2006 | Travis ................. H03L 7/10 327/105 |

(Continued)

FOREIGN PATENT DOCUMENTS

GB  2361119 A  10/2001

OTHER PUBLICATIONS

INPI Search Report and Written Opinion for FR 2006639 dated Mar. 2, 2021 (8 pages).

*Primary Examiner* — Adam D Houston
(74) *Attorney, Agent, or Firm* — Crowe & Dunlevy

(57) ABSTRACT

A start-up phase of a phase lock loop (PLL) circuit includes supplying, by a phase comparator, of control pulses during which an output signal frequency of an oscillator increases. The increase includes an application of a pre-charge current at the oscillator input. A determination is made of a time variation of the output signal frequency. At least one adjustment is made of the intensity of the pre-charge current depending on the at least one determined time variation so as to approach a reference time variation.

25 Claims, 8 Drawing Sheets

(56) References Cited

U.S. PATENT DOCUMENTS

| | | | | |
|---|---|---|---|---|
| 2012/0161835 | A1* | 6/2012 | David | H03L 7/146 |
| | | | | 327/157 |
| 2014/0176205 | A1* | 6/2014 | Nakura | H03L 7/0812 |
| | | | | 327/156 |
| 2017/0187384 | A1* | 6/2017 | Shimada | H03L 1/027 |
| 2017/0328712 | A1* | 11/2017 | Collin | H03D 7/00 |
| 2018/0076619 | A1* | 3/2018 | Gupta | H02J 1/02 |
| 2018/0115164 | A1* | 4/2018 | Gupta | H02M 1/36 |
| 2018/0145696 | A1* | 5/2018 | Sarda | H03L 7/0802 |
| 2018/0302097 | A1* | 10/2018 | Guo | H03C 3/0933 |
| 2019/0013815 | A1* | 1/2019 | Saric | H03L 7/095 |
| 2019/0020310 | A1* | 1/2019 | Modi | H04L 27/2647 |
| 2019/0326915 | A1* | 10/2019 | Moslehi Bajestan | H03L 7/093 |
| 2019/0377378 | A1* | 12/2019 | Gharibdoust | H03K 19/20 |
| 2019/0394849 | A1* | 12/2019 | Wang | H05B 45/382 |
| 2020/0099337 | A1* | 3/2020 | Powell | H03B 5/26 |
| 2020/0350919 | A1* | 11/2020 | Marcu | H03L 7/099 |
| 2020/0412371 | A1* | 12/2020 | Haneda | H03B 5/06 |
| 2021/0013893 | A1* | 1/2021 | Gailhard | H03L 7/099 |
| 2021/0036708 | A1* | 2/2021 | Gur | H03L 7/187 |
| 2021/0067164 | A1* | 3/2021 | Dal Toso | H03L 7/199 |
| 2021/0159903 | A1* | 5/2021 | Murata | H03K 5/00 |
| 2021/0184483 | A1* | 6/2021 | Wei | H02J 7/0068 |

* cited by examiner

PROCESS FOR MANAGING THE START-UP OF A PHASE-LOCKED LOOP, AND CORRESPONDING INTEGRATED CIRCUIT

PRIORITY CLAIM

This application claims the priority benefit of French Application for Patent No. 2006639, filed on Jun. 24, 2020, the content of which is hereby incorporated by reference in its entirety to the maximum extent allowable by law.

TECHNICAL FIELD

Implementations and embodiments relate to integrated circuits and, in particular, a phase-locked loop (PLL) circuit and, more particularly, the management of the start-up of a PLL circuit.

BACKGROUND

A phase-locked loop (PLL) circuit is generally used in digital systems requiring a high internal working frequency, for example of the order of several hundred megahertz.

In particular, the role of the phase-locked loop circuit is therefore to supply these digital systems, for example a programmable core or a microprocessor, with an internal clock signal having a high working frequency.

However, due to the presence of the feedback loop and the capacitive network necessary for the stability of the phase-locked loop, the start-up duration, that is to say the duration of time after which the loop has stabilized, with the reference signal and the output signal of the oscillator close to a mutual synchronization, can be very long, regularly greater than 100 µs.

For a given product or family of products, it is possible to determine by simulation this start-up duration for a reference temperature, for example 25° C., and for a given manufacturing process.

However, once the product is manufactured and in operation, it turns out that this start-up duration is within a duration range around the desired nominal duration.

This time range is sensitive to temperature and to possible variations in the manufacturing process, which can negatively impact the effective start-up duration of the loop.

However, a short start-up duration is an important parameter for low power products.

There is therefore a need to be able to obtain phase-locked loop start-up durations that are short, stable and reproducible regardless of the possible variations in temperature and in the manufacturing process, with reduced time ranges.

SUMMARY

According to one aspect a process for managing the operation of a phase-locked loop is proposed.

The loop includes a phase comparator and a voltage-controlled oscillator.

The operation of the phase-locked loop comprises a start-up phase including: a supply, by the phase comparator, of control pulses during each of them the output signal frequency (or output frequency) of the oscillator increases, said increase including an application of a pre-charge current at the oscillator input; at least one determination of a time variation of said output frequency; and at least one adjustment of the intensity of the pre-charge current depending on said at least one determined time variation so as to approach a reference time variation.

The time variation can be, for example, as a first approximation, the slope or the time gradient of the output frequency.

The reference time variation, for example a reference slope, was defined in simulation taking into account the features of the loop, to obtain at a reference temperature, for example 25° C., and with a given manufacturing process (for example, a process called slow process involving slow transistors and more resistive resistors, or else a process called "fast" process involving fast transistors and less resistive resistors, or else a process called regular process involving regular transistors and resistors whose resistive values have middle or nominal values, a desired start-up duration).

The inventors have observed that adjusting the level of the pre-charge current depending on the observed time variation, for example the slope, on the output frequency, in order to approach the reference slope will significantly overcome the variations in temperature and process, and therefore reduce the time range mentioned above and obtain a start-up duration that is stable and as close as possible to the desired start-up duration.

By way of example, without adjusting the pre-charge current according to the time variation of the output frequency, it is possible to obtain time ranges of the order of 20 to 60 microseconds, while this time range can be reduced to about 5 to 10 microseconds with said adjustment.

In practice, this adjustment of the pre-charge current can be performed only once, preferably at the beginning of the start-up phase, but it would be possible to do it several times during the start-up phase.

Said adjustment of the intensity of the pre-charge current may comprise a decrease in said intensity if the determined time variation is greater than the reference time variation and an increase in said intensity if the determined time variation is less than the reference time variation.

The phase-locked loop comprises, for example, in addition to the phase comparator, a first counter forming a first divider, for example an N-divider, of the output signal of the oscillator.

The phase comparator then receives on two inputs, a reference clock signal and a signal, called the feedback signal, derived from this first divider.

Several variations are possible to determine said time variation in the output signal frequency of the loop oscillator.

According to one possible variant, the determination of the time variation of said output frequency comprises: a determination of at least two current counting values of the first counter respectively upon the occurrence, during a control pulse, of at least two edges belonging to at least two different periods of the reference clock signal; and a determination of said time variation from said at least two current counting values.

For example, the difference between these two counting values related to the interval of time between them can be calculated.

According to another possible variant, the determination of the time variation of said output frequency comprises: after supplying a control pulse, a first count of a first number of output signal pulses of the oscillator between two edges belonging to two successive periods of the reference clock signal, a count during which any increase in the output frequency is prevented, for example by ignoring a control pulse supplied by the phase comparator; then after removing the first inhibition followed by supplying a subsequent control pulse, a second count of a second number of output signal pulses of the oscillator between two edges belonging to two successive periods of the reference clock signal, a count during which any increase in the output frequency is prevented, for example again by ignoring a control pulse supplied by the phase comparator; and a determination of said time variation from the first number and the second number.

For example, a difference between these two numbers can be used.

According to yet another possible variant wherein the reference clock signal supplied to the phase comparator has a duty cycle of 50%, the process comprises: a reset, during the start-up phase, at each first-type edge, for example at each rising edge, of the reference clock signal, of a first counter forming a first divider of the output signal of the voltage-controlled oscillator; a supply by the phase comparator receiving the reference signal and a feedback signal derived from the first divider, at each second-type edge, for example at each falling edge, of the reference signal, of a control pulse; and the determination of the time variation of said output frequency. This determination comprises: a determination of at least two current counting values of the first counter respectively upon the occurrence of at least two control pulses; and a determination of said time variation from said at least two current counting values.

For example, the difference between these two current counting values related to the time interval between them can be calculated.

In addition to the question mentioned above of the dependence on temperature and on variations in the manufacturing process, of the start-up duration of a phase-locked loop of the prior art, there is moreover, during this start-up phase, a frequency overshoot on the output signal of the loop oscillator, compared to its nominal final value. And this frequency overshoot can reach up to 25% of the nominal final value in a phase-locked loop of the prior art.

Such a frequency overshoot at start-up implies that the digital circuit of the PLL supports such a frequency. The speed of this circuit must therefore be increased, which in particular induces an increase in the leakage currents and dynamic power consumption.

There is consequently a need to limit the start-up duration of a phase-locked loop as well as the magnitude of this frequency overshoot.

A solution to this need has been proposed in United States Patent Application Publication No. 20210013893 (French Application for Patent No. 1907661), incorporated by reference.

More specifically, it has been proposed in this French patent application, that the start-up phase of the phase-locked loop comprises: a supply to the phase comparator of the loop, of a reference signal having a duty cycle of 50% and which can be derived from an initial reference clock signal not necessarily having a duty cycle of 50%; a reset, at each first-type edge, for example at each rising edge, of the reference signal, of the first divider of the output signal of the voltage-controlled oscillator of the loop; and a supply by the phase comparator receiving the reference signal and the feedback signal derived from the first divider, at each second-type edge, for example at each falling edge, of the reference signal, of a control pulse.

Embodiments described herein are compatible with the invention described in United States Patent Application Publication No. 20210013893 (French Application for Patent No. 1907661).

Thus, according to another possible variant, and in combination with these features described in United States Patent Application Publication No. 20210013893 (French Application for Patent No. 1907661), the determination of the time variation of said output frequency comprises: a first count, after supplying a control pulse, of a first number of output signal pulses of the oscillator between two edges of the reference clock signal spaced apart by half a period of the reference clock signal; a second count, after supplying a subsequent control pulse, of a second number of output signal pulses of the oscillator between two edges of the reference clock signal spaced apart by half a period of the reference clock signal; and a determination of said time variation from the first number and the second number.

Again a difference between these two numbers can be used.

Combining these features, and in particular providing a reference signal with a duty cycle of 50%, and resetting the loop divider at each rising edge (for example) of the reference signal, as well as adjusting the level of the pre-charge current depending on the determined time variation of the output frequency, not only allows to obtain a stable start-up duration and as close as possible to the desired start-up duration providing a time range in a large extent independent of temperature and variations in the manufacturing process, but also a significant reduction in the loop start-up duration as well as in the frequency overshoot.

Thus, as an indication, for a frequency of the reference signal equal to 2, 4, 8 or 16 MHz and a nominal output signal frequency of the oscillator equal to 832 MHz, a start-up duration of the order of thirty microseconds against a start-up duration of 70 to more than 100 microseconds is obtained for a conventional locking loop.

Likewise, a frequency overshoot is obtained on the output signal of the oscillator of the order of a few percent, for example of the order of 2%, against up to 25% for a conventional phase-locked loop.

In the case where there is an initial reference signal not having a duty cycle of 50%, then the supply of the reference signal advantageously comprises a division by two of this initial reference signal so as to obtain the reference signal having the duty cycle of 50% and, in this case, the feedback signal is not the output signal directly derived from the first divider of the loop but the output signal from the first divider, divided by two.

This allows any initial reference signal to be used, regardless of its duty cycle.

While it would be possible for the control pulse supplied by the phase comparator to be used in a charge pump circuit, it is particularly advantageous during the start-up phase to "short-circuit" this charge pump circuit, to directly apply the pre-charge current in a resistive capacitive filter connected to the oscillator input.

This further contributes to reducing the start-up duration of the loop and to making this start-up duration less dependent on the current constraints of the charge pump, constraints related to the stability of the loop.

According to one implementation, the resistive capacitive filter comprises: a first branch connected between said oscillator input and ground and including a resistive network connected in series with a first capacitor having a first capacitive value, said resistive network including a first resistor connected between said oscillator input and an intermediate node and having a first resistive value, and a second resistor connected between the intermediate node and the first capacitor and having a second resistive value; and a second branch connected between said oscillator input and ground and including a second capacitor having a second capacitive value.

The first capacitive value is then advantageously equal to a times the second capacitive value while the first resistive value is equal to a times the second resistive value.

The pre-charge current is then advantageously applied to said intermediate node.

A homogeneous increase in the two capacitive voltages at the terminals of the two capacitors is obtained, therefore a stable increase in the capacitive voltage supplied at the oscillator input is obtained.

According to one implementation, when the start-up phase comprises a reset of the first divider on the edge of the reference clock signal, the start-up phase ends when the duration of the control pulse is less than a few percent, for example 2%, of the product of the output signal period of the oscillator and the division ratio of the first divider.

More generally, and in particular when the first divider is not reset on the edge of the reference clock signal, the start-up phase can end when the phase comparator detects the feedback signal before the reference clock signal, or else after the expiration of a start-up duration, defined for example during the design of the product.

According to one implementation, when the start-up phase has ended, the output of the phase comparator is connected to a charge pump circuit, the output of which is connected to the input of the voltage-controlled oscillator.

In other words, when during the start-up phase, the charge pump circuit was disconnected and a pre-charge current was applied at the resistive capacitive filter, this time at the end of the start-up phase, the charge pump circuit is reconnected to the phase comparator.

Of course, if during the start-up phase the charge pump circuit was left connected to the phase comparator, this connection will not be changed at the end of the start-up phase.

According to one implementation, when during the start-up phase, the initial reference signal was divided by two as well as the output signal of the first divider, these divisions by two are no longer carried out when the start-up phase ends.

In other words, when the start-up phase ends, the initial reference signal is supplied to the phase comparator while the feedback signal supplied to the phase comparator is the output signal of the first divider.

Moreover, when the start-up phase ends, it is advantageously possible to perform a final reset of the first divider on the first edge of a first type, for example the first rising edge, of the reference signal following the end of the start-up phase.

This allows to synchronize the reference signal and the feedback signal derived from the first divider.

According to another aspect, an integrated circuit is proposed, comprising: a phase-locked loop including a voltage-controlled oscillator and a phase comparator configured to supply, during a start-up phase of the loop, control pulses; a control circuit configured, during the start-up phase, to increase the output signal frequency of the oscillator during each control pulse and including a current source that can be regulated and activated during each control pulse and configured to apply, once activated, a pre-charge current at the oscillator input; a processing circuit configured to perform, during said start-up phase, at least one determination of a time variation of said output frequency; and a regulating circuit configured to regulate, during said start-up phase, said current source to perform at least one adjustment of the intensity of the pre-charge current depending on said at least one determined time variation so as to approach a reference time variation.

According to one embodiment, the regulating circuit is configured to regulate the current source so as to decrease said intensity if the determined time variation is greater than the reference time variation and increase said intensity if the determined time variation is less than the reference time variation.

According to one possible embodiment, the loop further comprises a first counter forming a first divider of the output signal of the voltage-controlled oscillator, and the integrated circuit comprises a supply circuit configured to supply the phase comparator of the loop with a reference clock signal, the phase comparator being configured to also receive the feedback signal, and the processing circuit is configured to perform: a determination of at least two current counting values provided by the first counter respectively upon the occurrence, during a control pulse, of at least two edges belonging to at least two different periods of the reference clock signal; and a determination of said time variation from said at least two current counting values.

According to another possible embodiment, the integrated circuit comprises a supply circuit configured to supply the phase comparator of the loop, with a reference clock signal, and an inhibition circuit configured to inhibit or not any supply of a control pulse to the control circuit, and the processing circuit is configured to perform: after supplying a control pulse by the phase comparator, a first count of a first number of output signal pulses of the oscillator between two edges belonging to two successive periods of the reference clock signal, a count during which the inhibition circuit are configured to carry out a first inhibition of any supply of control pulses to the control circuit; then after removing the first inhibition by the inhibition circuit followed by supplying a subsequent control pulse by the phase comparator, a second count of a second number of output signal pulses of the oscillator between two edges of two successive periods of the reference clock signal, a count during which the inhibition circuit are configured to carry out a second inhibition of any supply of control pulses to the control circuit; and a determination of said time variation from the first number and the second number.

According to yet another possible embodiment, the loop further comprises a first counter forming a first divider of the output signal of the voltage-controlled oscillator, and the integrated circuit comprises: a supply circuit configured to supply the phase comparator of the loop with a reference clock signal having a duty cycle of 50%, the phase comparator being configured to also receive the feedback signal; a reset circuit configured to perform during said start-up phase, a reset of the first counter at each first-type edge of the reference clock signal, the phase comparator being configured to supply a control pulse at each second-type edge of the reference signal, and the processing circuit is configured to perform: a determination of at least two current counting values provided by the first counter respectively upon the occurrence of at least two control pulses; and a determination of said time variation from said at least two current counting values.

According to yet another possible embodiment, the loop further comprises a first counter forming a first divider of the output signal of the voltage-controlled oscillator, and the integrated circuit comprises: a supply circuit configured to supply the phase comparator of the loop with a reference clock signal having a duty cycle of 50% (for example derived from an initial clock signal not necessarily having a duty cycle of 50%), the phase comparator being configured to also receive the feedback signal; a reset circuit configured to perform, during said start-up phase, a reset of the first counter at each first-type edge of the reference clock signal, the phase comparator being configured to supply a control pulse at each second-type edge of the reference signal; and the processing circuit is configured to perform: a first count, after supplying a control pulse, of a first number of output signal pulses of the oscillator between two edges of the reference clock signal spaced apart by half a period of the reference clock signal; a second count, after supplying a subsequent control pulse, of a second number of output signal pulses of the oscillator between two edges of the reference clock signal spaced apart by half a period of the reference clock signal; and a determination of said time variation from the first number and the second number.

According to one embodiment, the supply circuit includes an input for receiving an initial reference signal, a divide-by-two circuit connected to said input, and an output configured to supply as a reference signal, the initial reference signal divided by two and the integrated circuit further comprises another divide-by-two circuit connected between the output of the first divider and the phase comparator.

According to one embodiment, the current source is configured to apply, once activated, the pre-charge current in a resistive capacitive filter connected at the oscillator input.

According to one embodiment, the resistive capacitive filter comprises: a first branch connected between said oscillator input and ground and including a resistive network connected in series with a first capacitor having a first capacitive value, said resistive network including a first resistor connected between said oscillator input and an intermediate node and having a first resistive value and a second resistor connected between the intermediate node and the first capacitor and having a second resistive value; and a second branch connected between said oscillator input and ground and including a second capacitor having a second capacitive value; the first capacitive value being equal to a times the second capacitive value, and the first resistive value is equal to a times the second resistive value; and wherein the current source is connected to said intermediate node.

According to one embodiment, the integrated circuit further comprises a detection circuit configured to detect the end of the start-up phase.

According to one embodiment, the detection circuit is configured to detect the duration of the control pulse and/or the nature of the pulse signal supplied by the phase comparator.

Thus, the detection circuit can be configured to supply a signal representative of the end of the start-up phase when the duration of the control pulse is less than a few percent of the product of the output signal period of the oscillator and the division ratio of the first divider.

Alternatively, the detection circuit can be configured to supply a signal representative of the end of the start-up phase when the first pulse of the pulse signal supplied by the phase comparator is detected, requesting a decrease in the control voltage of the voltage-controlled oscillator.

According to one embodiment, the integrated circuit is configured, when the start-up phase ends, to connect the output of the phase comparator to a charge pump circuit, the output of which is connected to the input of the voltage-controlled oscillator.

According to one embodiment, when the start-up phase ends, the supply circuit is configured to supply the initial reference signal to the phase comparator, and the integrated circuit includes a control circuit configured to deactivate said other divide-by-two circuit, so that the feedback signal supplied to the phase comparator is the output signal of the first divider.

According to one embodiment, the reset circuit is configured, when the start-up phase ends, to perform a final reset of the first divider on the first edge of a first type of the reference signal following the end of the start-up phase.

BRIEF DESCRIPTION OF THE DRAWINGS

Other advantages and features of the invention will become apparent upon examining the detailed description of the implementations and embodiments of the invention, which are in no way limiting, and of the appended drawings wherein.

DETAILED DESCRIPTION

Figure 1:
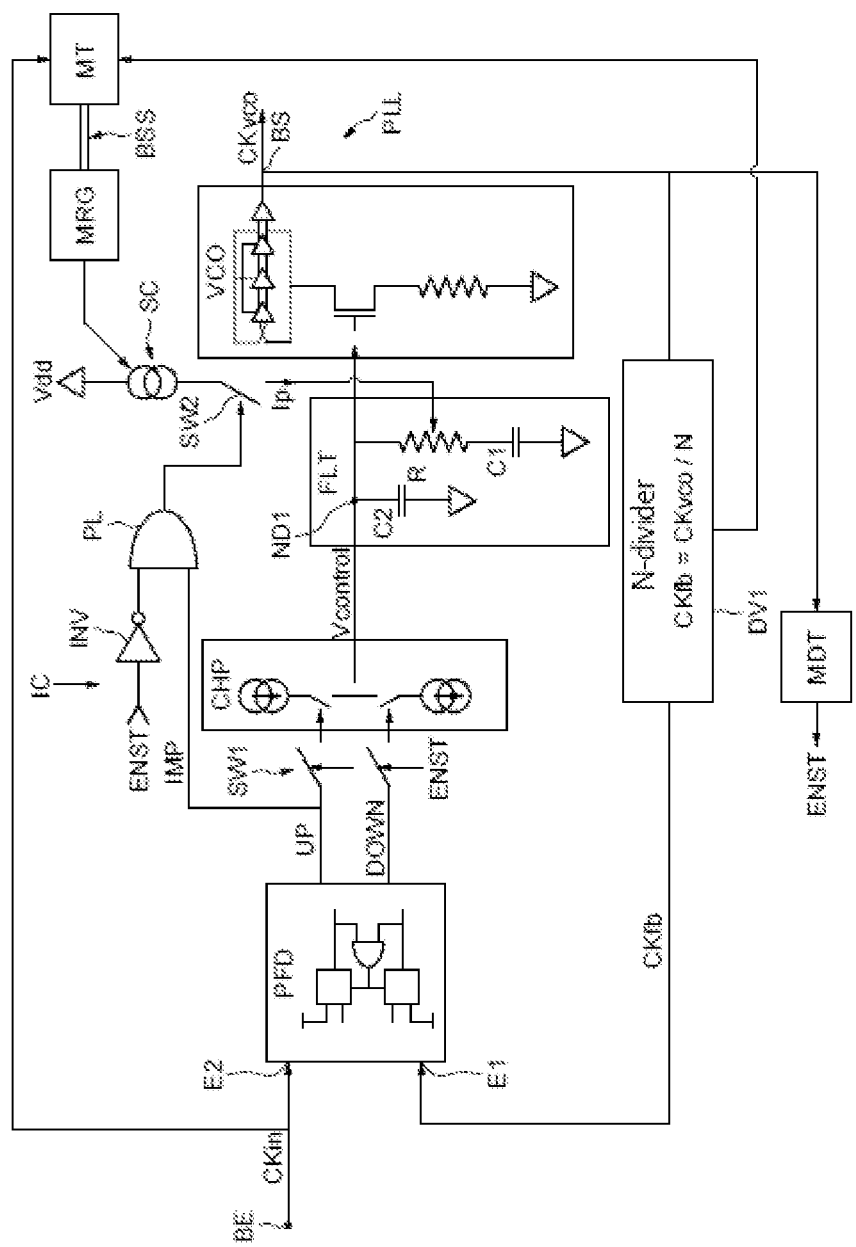
FIG. 1 is block diagram of an integrated circuit comprising a phase-locked loop (PLL) circuit.

In FIG. 1, the reference IC designates an integrated circuit comprising a phase-locked loop (PLL) including an input BE for receiving a reference signal CKin and an output terminal BS for supplying the output signal $CK_{VCO}$ supplied by a voltage-controlled oscillator VCO.

For example, the frequency of the reference signal CKin can be equal to 16 MHz while the frequency of the output signal $CK_{VCO}$ can be equal to 832 MHz.

Moreover, the output terminal BS of the phase-locked loop PLL is connected to the input of a first divider DV1, for example a fractional divider, intended to divide by N the signal $CK_{VCO}$ supplied by the local oscillator VCO.

The division ratio N is equal to the ratio between the frequency of the signal $CK_{VCO}$ and the frequency of the initial reference signal CKin.

By way of example, here, this division ratio is equal to 832/16, that is to say 52. This N-divider, DV1, has a structure which is conventional and known per se and is regularly formed by a first counter.

The output signal of the first divider is referenced CKfb.

The phase-locked loop PLL includes a start-up phase or step at the end of which the reference signal CKin supplied at the input of the phase comparator PFD (of conventional and known structure) of the loop and the signal CKfb are almost synchronized. Of course when the reference signal CKin and the signal CKfb are almost synchronized, the reference signal and the output signal $CK_{VCO}$ are also almost synchronized.

The feedback signal CKfb is supplied to the first input E1 of the phase comparator PFD.

The reference signal CKin is received on the second input E2 of the phase comparator PFD.

It is assumed in this example that the reference signal CKin has any duty cycle.

The end of this start-up phase occurs here in this example, when a logic signal ENST has, for example, the logic value "1".

The phase comparator PFD conventionally supplies, depending on the signals present at its two inputs, either an UP control pulse intended to increase the control voltage at the input of the oscillator VCO or a DOWN control pulse intended to decrease this control voltage.

The phase-locked loop PLL moreover includes a charge pump circuit CHP, of a conventional structure known per se, intended to receive the two UP and DOWN control pulses, and supplying a current to a resistive capacitive filter which produces the control voltage Vcontrol applicable to the oscillator input.

However, in this embodiment, the phase comparator PFD is connected to the input of the charge pump circuit CHP by a set of first switches SW1 that can be controlled by the logic signal ENST.

The loop PLL then includes a resistive capacitive filter FLT having a node ND1 connected to the control input of the voltage-controlled oscillator VCO.

In another embodiment, the set of first switches SW1 can be replaced by logic gates, one input of which is connected to the logic signal ENST which allows to open the switches internal to the charge pump circuit CHP.

Thus, in this embodiment, when the phase-locked loop is in its start-up phase (ENST=0, for example), the switches SW1 are open, disconnecting the charge pump circuit CHP from the outputs of the phase comparator PFD.

Figure 2:
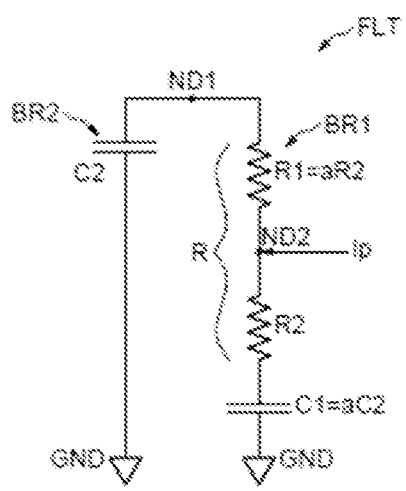
FIG. 2 is a circuit diagram for a filter.

As illustrated in FIG. 2, the filter FLT here includes a first branch BR1 connected between the node ND1 and ground GND and a second branch BR2 also connected between the node ND1 and ground GND.

The first branch comprises a resistive network R connected in series with a first capacitor C1.

The resistive network R includes a first resistor R1 connected between the node ND1 and an intermediate node ND2 and a second resistor R2 connected between the intermediate node ND2 and the first capacitor C1.

For the purposes of simplification, C1, C2, R1 and R2 will also designate respectively the capacitive value of the first capacitor C1, the capacitive value of the second capacitor C2, the resistive value of the first resistor R1 and the resistive value of the second resistor R2.

In this example, the capacitive value C1 of the first capacitor C1 is equal to a times the capacitive value C2 of the second capacitor C2, that is to say C1=a*C2. As an indication, a is of the order of 10.

The resistive value R1 of the first resistor R1 is in turn equal to a times the resistive value R2 of the second resistor R2, that is to say R1=a*R2.

Therefore, the product R2*C1 is equal to the product R1*C2, that is to say a times the product R2*C2.

And, during the start-up phase, a pre-charge current Ip will be applied to the intermediate node ND2.

And, since C1 is equal to a*C2, it will take the same time to pre-charge C1 and C2, this time being equal to the filter constant divided by a.

As illustrated in FIG. 1, this pre-charge current Ip is derived from a current source SC which can be activated by means of a second switch SW2 controlled by the output of an AND logic gate, referenced PL.

This gate PL receives on a first input, the control pulse IMP of the UP signal, and on a second input, the signal ENST inverted by an inverter INV.

During the start-up phase, the signal ENST is at "0" and it is at "1" after the start-up phase.

Therefore, during the start-up phase the second switch SW2 is controlled by the pulses of the UP signal, while after the start-up phase the second switch SW2 is always open.

More specifically, during the start-up phase, if the UP signal is at the high level (representative of a pulse IMP), the switch SW2 is closed and the current source supplies the pre-charge current Ip to the intermediate node ND2.

This situation lasts as long as the UP signal is set to 1, that is to say as long as the control pulse IMP is present.

On the other hand, as soon as the pulse IMP disappears (UP signal at zero) the switch SW2 is open and no pre-charge current is supplied to the node ND2.

The capacitive filter FLT is therefore charged during the pulses IMP and these charges allow to increase the control voltage at the input of the oscillator VCO, which consequently allows to increase the output signal frequency of this oscillator.

The current source SC and the filter FLT therefore form part of control circuit configured to increase the control voltage of the oscillator during said control pulse IMP.

Moreover, the current source SC can be regulated by regulating circuit MRG as will be seen in more detail below.

The integrated circuit IC incorporating the phase-locked loop PLL also includes detection circuit MDT configured to detect the end of the start-up phase and consequently supply the logic value 1 to the signal ENST.

The end of the start-up phase is considered to be reached, for example, when the phase comparator detects the feedback signal CKfb before the reference clock signal CKin (which corresponds to the detection of the first control pulse corresponding to the high state of the DOWN signal), or else after the expiration of a start-up duration, defined for example during the design of the product.

In addition to the circuits which have just been described, the integrated circuit IC generally comprises processing circuit MT configured to perform, during said start-up phase, at least one determination of a time variation of the frequency of the oscillator VCO output signal $CK_{VCO}$.

The regulating circuit MRG is configured to regulate, during said start-up phase, said current source SC to perform at least one adjustment of the intensity of the pre-charge current Ip depending on said at least one determined time variation so as to approach a reference time variation.

More specifically, as will be seen in more detail below, the regulating circuit MRG is configured to regulate the current source so as to reduce said intensity Ip if the determined time variation is greater than the reference time variation and increase said intensity Ip if the determined time variation is less than the reference time variation.

Figure 3:
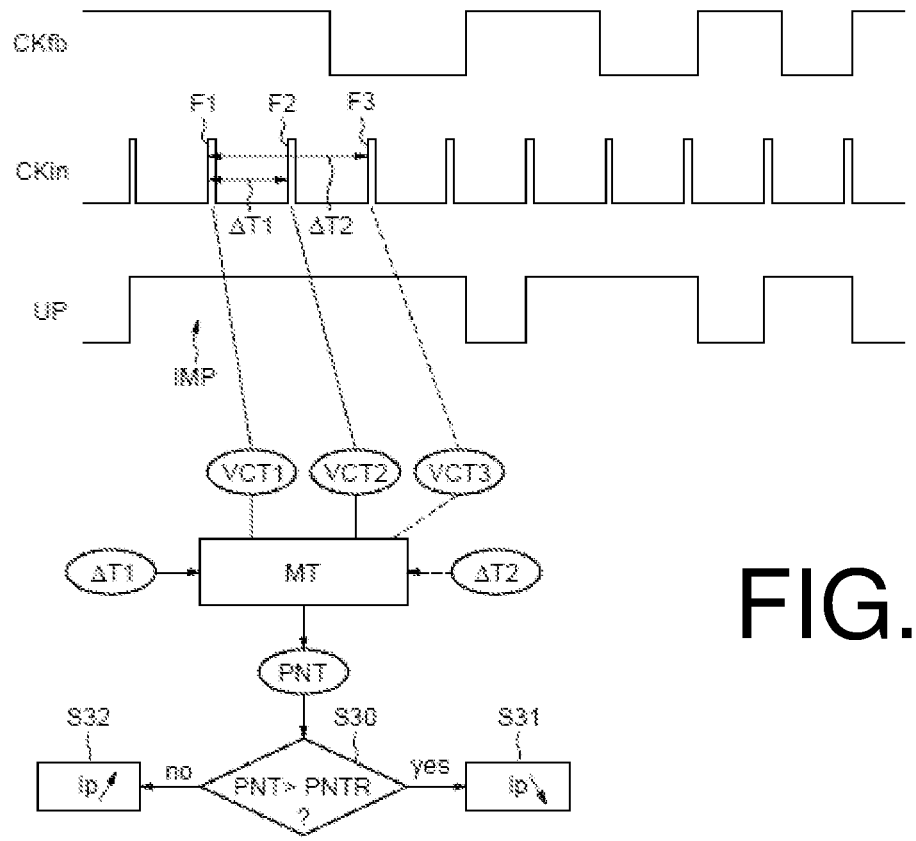
FIG. 3 is a timing diagram and corresponding processing circuit operation.

In the embodiment of FIG. 1, and as illustrated in FIG. 3, the processing circuit MT is configured to perform here:
  a determination of two current counting values VCT1, VCT2 provided by the first counter (N-divider) DV1 respectively upon the occurrence, during a control pulse IMP, of two edges, here two rising edges, F1, F2 belonging to two different periods of the reference clock signal CKin, and
  a determination of said time variation PNT from said two current counting values VCT1, VCT2.

The counting values of the divider DV1 at an instant t can be obtained in a manner which is conventional and known per se by memorizing at this instant t the values of the internal registers of the divider DV1.

The time variation, here the slope PNT, of the frequency of the oscillator output signal, can then be obtained by the formula (VCT2−VCT1)/ΔT1, where ΔT1 designates the duration between the two rising edges F1 and F2.

It will be noted that it is simpler, but not essential, to start the counter DV1 on a rising edge of CKin, for example on the first rising edge F1, so as to avoid a reset of the counter DV1 before the expiration of the counting time ΔT1.

Of course, it would have been possible to take as the second value of the counter, the value VCT3 provided by the counter DV1 during the rising edge F3.

In this case the slope PNT of the frequency of the oscillator output signal can then be obtained by the formula (VCT3−VCT1)/ΔT2, where ΔT2 designates the duration between the two rising edges F1 and F3.

This slope value is supplied on a bus BSS to the regulating circuit which in a step S30 (FIG. 3) compare this slope PNT value with a reference slope PNTR value, determined for example by simulation taking into account features of the loop, to obtain at a reference temperature, for example 25° C., and with a given manufacturing process, a desired start-up duration.

If PNT is greater than PNTR, then the regulating circuit regulates the current source SC so as to decrease (step S31) the pre-charge current Ip so that it takes the value corresponding to the slope PNTR. The slope PNT will therefore approach the reference slope PNTR.

If PNT is less than PNTR, then the regulating circuit regulates the current source SC so as to increase (step S32) the pre-charge current Ip so that it takes the value corresponding to the slope PNTR. The slope PNT will therefore approach the reference slope PNTR.

In the embodiment and implementation illustrated in FIGS. 4 and 5, the integrated circuit differs from that described with reference to FIGS. 1 to 3, in that it further comprises an inhibition circuit MHB configured to inhibit or not any supply of a control pulse IMP to the control circuit SC.

Inhibiting the supply of a pulse IMP corresponds to setting the UP signal in the low state, which opens the switch SW2 and prevents the supply of the pre-charge current Ip to the filter FLT.

Moreover, the processing circuit MT includes an additional counter CPT3 configured to count a number of output signal $CK_{VCO}$ pulses.

Figure 5:
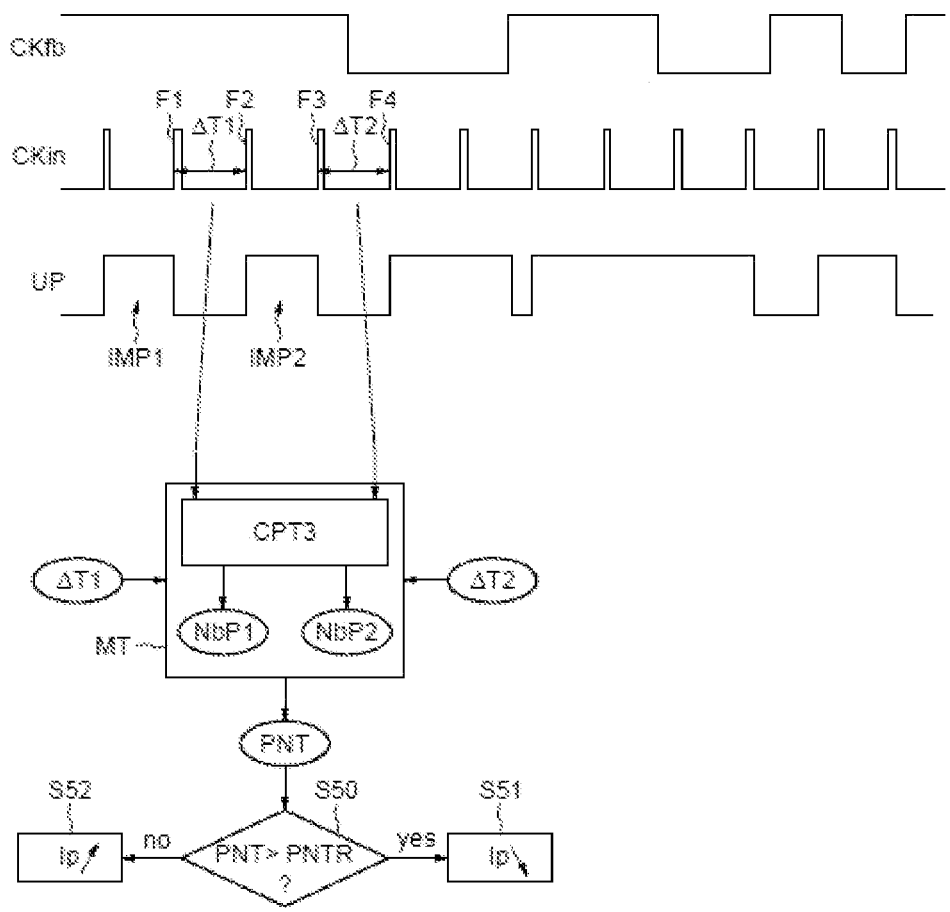
FIG. 5 is a timing diagram and corresponding processing circuit operation.

As illustrated in FIG. 5, the processing circuit is configured to perform, after supplying a first control pulse IMP1 (UP signal in the high state) by the phase comparator PFD, a first count, by the additional counter CPT3, of a first number of output signal pulses NbP1 of the oscillator between two edges F1, F2 belonging to two successive periods of the reference clock signal CKin.

During this first counting, the inhibition circuit MHB is configured to perform a first inhibition of any supply of a control pulse to the control circuit (signal IMP in the low state).

Figure 4:
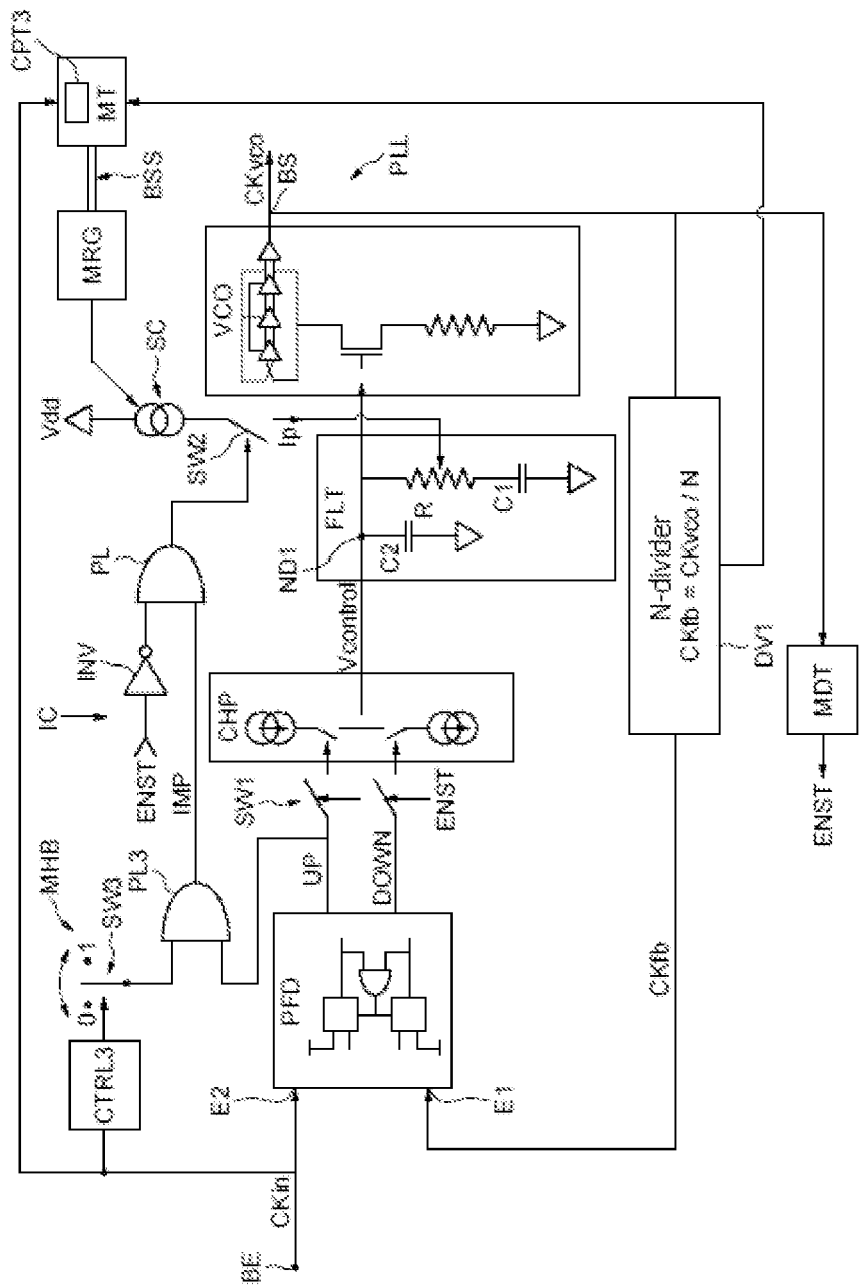
FIG. 4 is block diagram of an integrated circuit comprising a PLL circuit.

In this regard, as illustrated in FIG. 4, the inhibition circuit MHB includes an AND gate referenced PL3 receiving on a first input the UP signal and on a second input either the logic value 0 or the logic value 1 depending on the position of a switch SW3 controlled by a signal emanating from a control circuit CTRL3 receiving the signal CKin.

Thus, upon the occurrence of the rising edge F1 and until the occurrence of the rising edge F2, the switch SW3 is switched to 0 which inhibits the pulse IMP (signal in the low state).

Then after removing the first inhibition by the inhibition circuit MEM (switch SW3 on 1) followed by supplying a second control pulse IMP2 by the phase comparator, the additional counter CPT3 proceeds to a second count of a second number NbP2 of output signal $CK_{VCO}$ pulses of the oscillator between two rising edges F3, F4 of two successive periods of the reference clock signal CKin.

During the second counting, the inhibition circuit MHB is configured to perform a second inhibition of any supply of a control pulse (switch SW3 on 0 therefore signal IMP in the low state) to the control circuit.

The processing circuit MT determines said time variation, here the slope, of the output frequency from the first number NbP1 and from the second number NbP2.

More specifically, the ratio NbP1/ΔT1 provides a first value of the output frequency and the ratio NbP2/ΔT2 provides a second value of the output frequency.

The difference between these two values, related to the time interval between them, provides a value of the slope PNT.

Steps S50, S51 and S52 carried out by the regulating circuit MRG are similar to steps S30, S31 and S32 described above.

In the embodiment and implementation illustrated in FIGS. 6 and 7, the integrated circuit differs from that described with reference to FIGS. 1 to 3, in that the first counter DV1 can be reset by receiving on its reset input RST a reset signal or pulse IMPRST and in that it further comprises reset circuit MRST configured to perform during said start-up phase, the reset (reset pulse IMPRST) of the first counter DV1 at each rising edge, for example, of the reference clock signal CKin, the phase comparator PHD being configured to supply a control pulse IMP (UP signal in the high state) at each falling edge, for example, of the reference signal CKin.

Moreover, the reference clock signal CKin has a duty cycle of 50%.

This embodiment and implementation is compatible with the invention described in United States Patent Application Publication No. 20210013893 (French Application for Patent No. 1907661), incorporated by reference, and therefore combines the advantages thereof.

Figure 7:
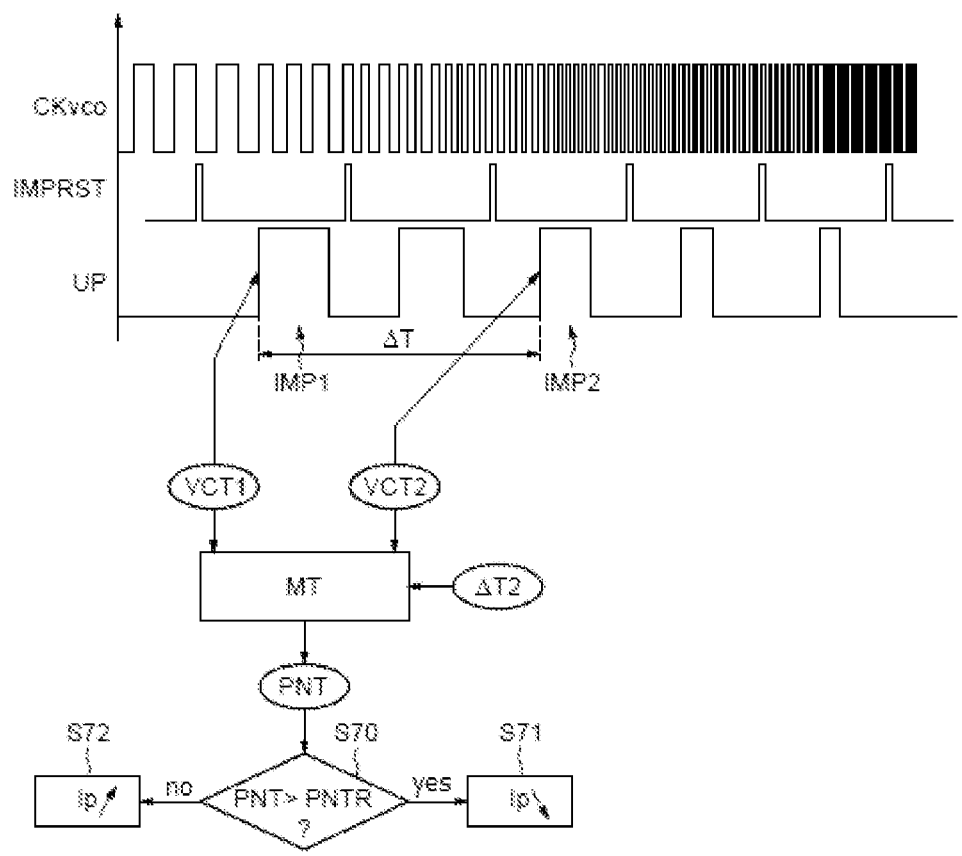
FIG. 7 is a timing diagram and corresponding processing circuit operation.

As illustrated in FIG. 7, the processing circuit MT are configured to perform here:
a determination of two current counting values VCT1 and VCT2 provided by the first counter DV1 respectively upon the occurrence of two control pulses IMP1, IMP2, and
a determination of said time variation PNT from said current counting values VCT1, VCT2, temporally spaced by the duration ΔT.

This determination is carried out in a similar manner to what has been described with reference to FIG. 3 and the steps S70, S71 and S72 carried out by the regulating circuit MRG are similar to the steps S30, S31 and S32 described above.

In this implementation and embodiment providing for a reset of the first divider DV1 on the edge of the reference clock signal CKin, the end of the start-up phase is considered to be reached when the duration of the control pulse IMP corresponding to the high state of the UP signal is less than a few percent of the product of the nominal period $T_{CKVCO}$ of the output signal of the oscillator VCO and the division ratio N.

For example, this threshold can be taken equal to 2%.

Also, according to a first possibility, to detect this condition of the end of the start-up phase, the detection circuit MDT can be configured to count the number of edges of the signal $CK_{VCO}$ during the duration of the pulse IMP.

According to another possible embodiment, the means MDT can include a low-pass filter receiving the UP signal and the time constant of which is related to said threshold of a few percent.

Depending on whether the output of this filter supplies or not a high signal, the means MDT will supply either the logic value "0" or the logic value "1" of the signal ENST.

Alternatively, the end of the start-up phase can also be considered to be reached when the first control pulse corresponding to the high state of the DOWN signal is detected.

In the embodiment and implementation illustrated in FIGS. 8 and 9, the integrated circuit differs from that described with reference to FIGS. 6 and 7, in that the duty cycle of the clock signal received on the input BE can be arbitrary and not necessarily equal to 50%.

This embodiment and implementation is also compatible with the invention described in United States Patent Application Publication No. 20210013893 (French Application for Patent No. 1907661) and therefore combines the advantages thereof.

Figure 8:
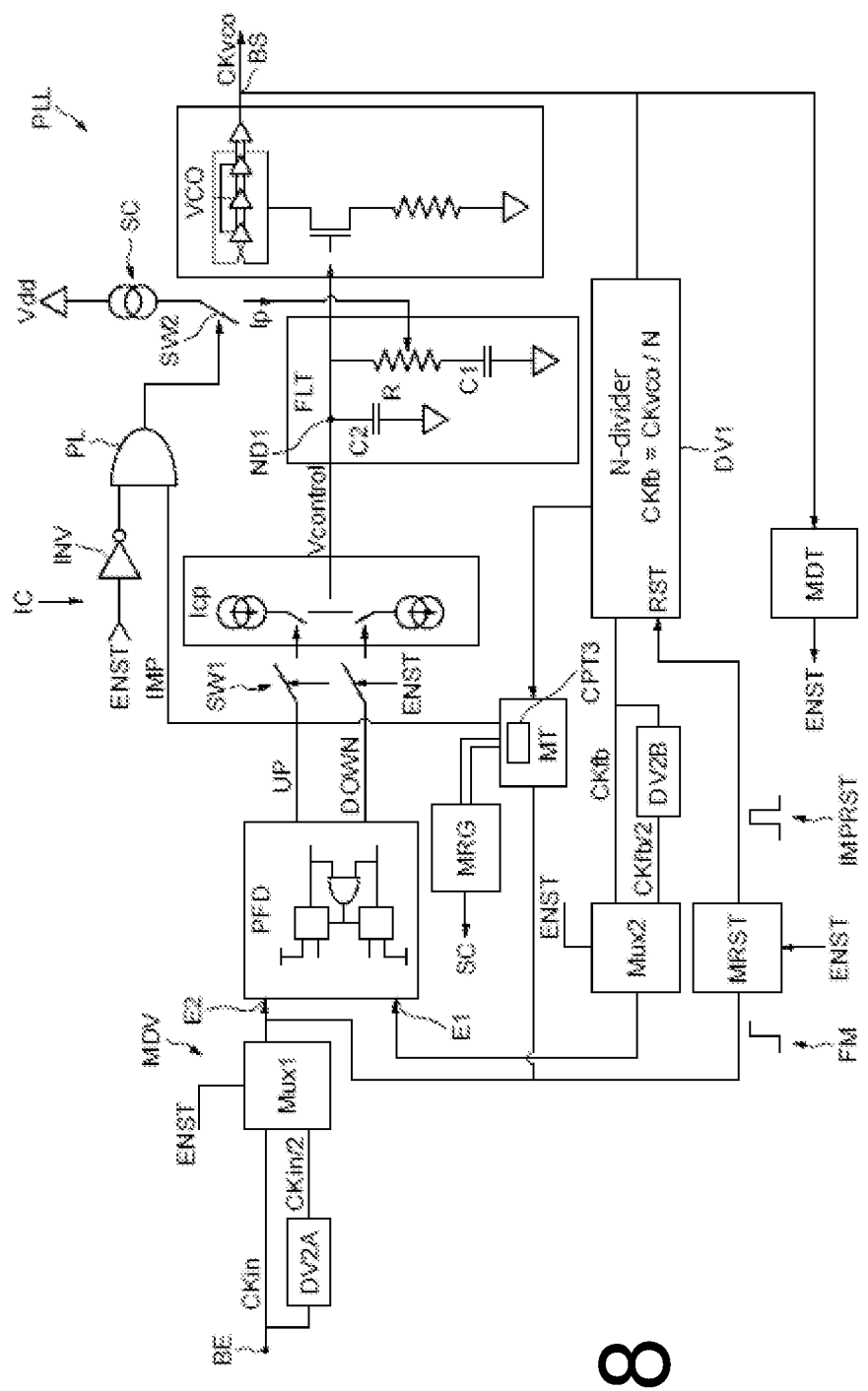
FIG. 8 is block diagram of an integrated circuit comprising a PLL circuit.

As illustrated in FIG. 8, the input BE receives an initial reference signal CKin.

For example, the frequency of the initial reference signal CKin may be 16 MHz while the frequency of the output signal $CK_{VCO}$ may be 832 MHz.

As indicated above, the initial reference signal CKin has any duty cycle, in particular other than 50%.

The loop PLL comprises in this regard supply circuit MDV configured to supply on the second input E2 of the phase comparator PFD, the reference clock signal CKin/2 which is a division by two of the initial reference signal CKin.

In this regard, the supply circuit here includes for example a divide-by-two circuit, DV2A, which is in fact a counter, connected to the input terminal BE and which supplies the reference clock signal CKin/2.

This reference clock signal CKin/2 therefore has a duty cycle of 50%.

The supply circuit MDV moreover includes a first multiplexer Mux1, controlled by the signal ENST, receiving on the one hand the reference signal CKin/2 and the initial reference signal CKin.

During the start-up phase, that is to say when the logic signal ENST has the logic value "0", the multiplexer Mux1 supplies on the input E2 the initial reference signal divided by two which thereby forms the reference signal received on the second input E2 of the phase comparator PFD.

The feedback signal supplied to the first input E1 of the phase comparator PFD is derived from a second multiplexer Mux2 also controlled by the signal ENST.

The output signal of the first divider CKfb is supplied to a first input of the second multiplexer Mux2.

The second input of the second Mux2 receives the signal CKfb/2 supplied by another divide-by-two circuit DV2B and which consequently results from the division by two of the signal CKfb.

Thus, in this example, during the start-up phase of the loop PLL, since the phase comparator input E2 receives the reference signal CKin/2, the feedback signal supplied on the first input E1 of the phase comparator is the signal CKfb/2.

The reset of the first divider DV1 is as indicated above obtained by applying a reset pulse IMPRST to the reset input RST of the divider.

This reset pulse IMPRST is obtained, during the start-up phase, by reset circuit MRST in response to each rising edge FM of the reference signal which is here the signal CKin/2.

Of course, it would have been possible to perform this reset on each falling edge of the signal CKin/2.

Moreover, once the start-up phase ends, the means MRST will supply a final reset pulse on the first rising edge of the reference signal, which this time will be the signal CKin, which follows the end of the start-up phase.

The reset circuit MRST can easily be implemented by means of logic circuits.

Figure 9:
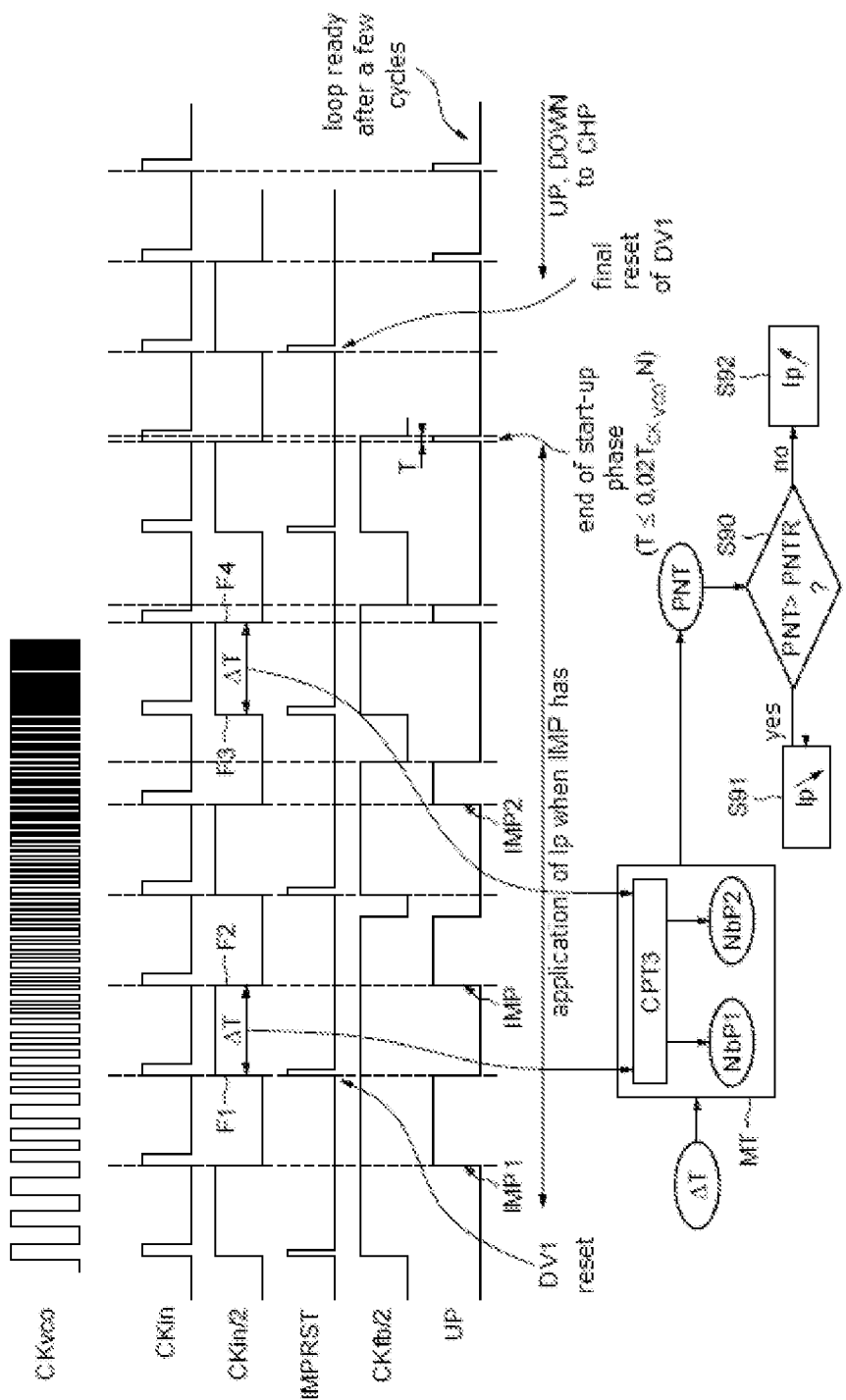
FIG. 9 is a timing diagram and corresponding processing circuit operation.

Reference is now made more particularly to FIG. 9 which has the shape of a time chronogram.

On the second line of this figure, the initial reference signal CKin is shown which, as can be seen, has a duty cycle different from 50%.

The reference signal CKin/2 is shown on the third line, which is resulting from the division by two of the initial reference signal, and which this time has a duty cycle of 50%.

This signal CKin/2 is, as explained above, the reference signal supplied to the second input E2 of the phase comparator PFD.

Moreover, it can be seen that at each rising edge of the reference signal CKin/2, a reset pulse IMPRST which resets the first divider DV1, that is to say which resets to 0 the counter forming this first divider, is emitted by the reset circuit MRST.

Moreover, on each falling edge of the reference signal CKin/2, the phase comparator PFD compares the phase of the reference signal CKin/2 with the phase of the feedback signal CKfb/2 and consequently supplies the control pulse IMP of the UP signal.

This pulse IMP allows, when it is present, to apply the pre-charge current Ip to the intermediate node ND2 of the filter FLT.

In this regard, the processing circuit MT are here configured to perform:

a first count, after supplying a first control pulse IMP1, of a first number NbP1 of output signal $CK_{VCO}$ pulses of the oscillator between two edges F1, F2 of the reference clock signal spaced apart by half a period ΔT of the reference clock signal CKin/2, while the UP signal is set to 0;

a second count, after supplying a second control pulse IMP2, of a second number NbP2 of output signal pulses of the oscillator between two edges F3, F4 of the reference clock signal spaced apart by half a period ΔT of the reference clock signal CKin/2, while the UP signal is set to 0; and a determination of said time variation PNT from the two numbers NbP1 and NbP2.

As in the case of FIG. 4, these counts are carried out by an additional counter CPT3.

The ratio NbP1/ΔT provides a first value of the output frequency and the ratio NbP2/ΔT provides a second value of the output frequency.

The difference between these two values, related to the time interval between them, provides a value for the slope PNT.

The steps S90, S91 and S92 performed by the regulating circuit MRG are similar to steps S30, S31 and S32 described above.

Note that as this start-up phase unfolds, the duration of the UP signal pulse IMP decreases since the output frequency of the signal $CK_{VCO}$ increases.

Figure 6:
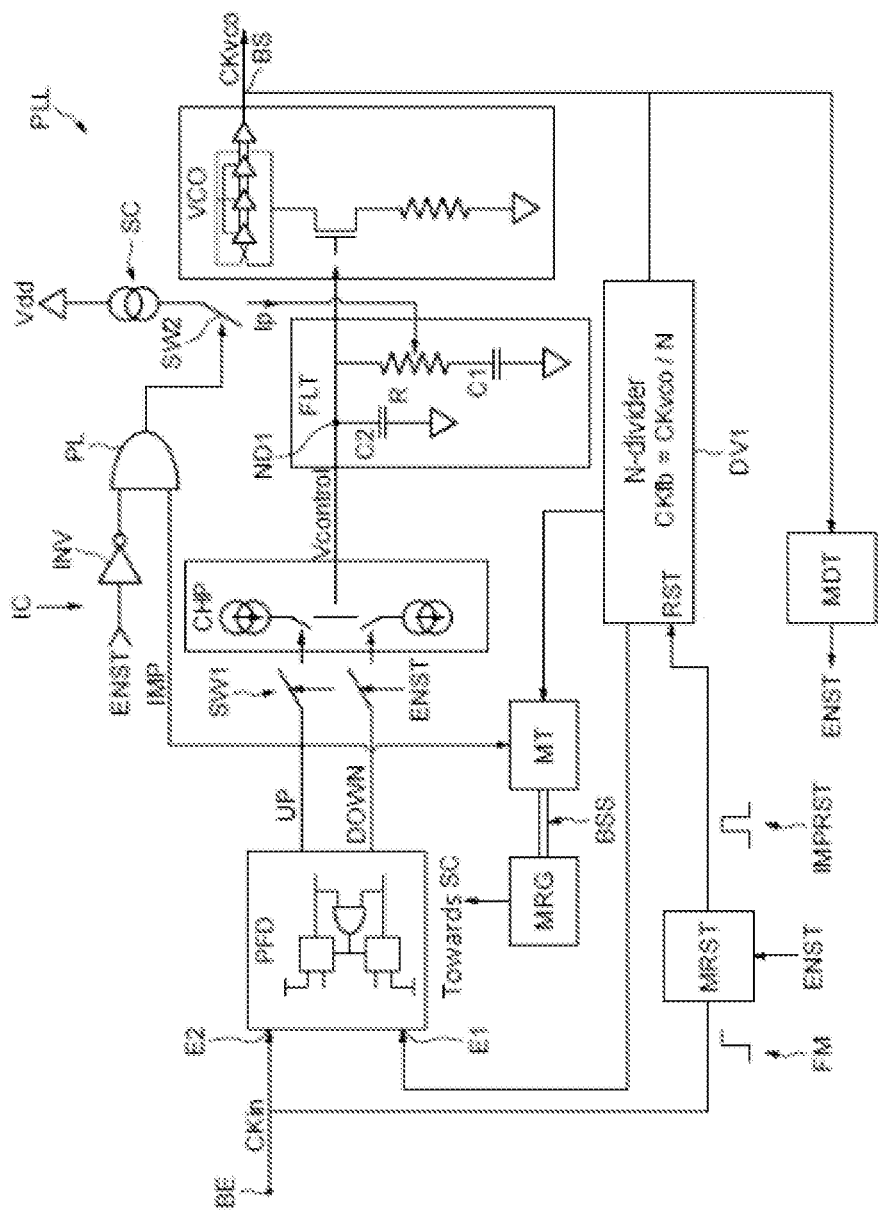
FIG. 6 is block diagram of an integrated circuit comprising a PLL circuit.

And, as indicated above with reference to FIGS. 6 and 7, when the duration T of the pulse IMP is less than or equal to 2% of the product of the ratio of division N by the period $TCK_{VCO}$ of the oscillator signal, or when a DOWN signal occurs, the control signal ENST switches to 1, marking the end of the start-up phase.

At this instant, the first multiplexer Mux1 supplies, on the second input E2 of the phase comparator, the initial reference signal CKin which becomes the reference signal.

Moreover, the feedback signal supplied on the first input E1 of the phase comparator PFD becomes the signal CKfb derived directly from the divider (that is to say without having been divided by two beforehand).

At the same time, the switches SW1 are closed, connecting the two outputs (respectively supplying the two UP and DOWN signals) of the phase comparator PFD to the inputs of the charge pump circuit so as to recover the conventional operation of a phase-locked loop.

The switch SW2 is open, interrupting the application of the pre-charge current Ip.

The current which allows for regulating the control voltage Vcontrol of the local oscillator VCO is this time the current Icp supplied by the charge pump circuit.

This being the case, in order to accelerate the synchronization of the signal $CK_{VCO}$ and of the reference signal CKin, the circuit MRST proceeds, as indicated above, to a final reset of the first divider DV1 during the first rising edge of the reference signal CKin which follows the end of the start-up phase.

The phase-locked loop will then be ready to supply its output signal after a few cycles.

This output signal could, for example, be used as a clock signal for a microprocessor.

The invention claimed is:

1. A process for managing operation of a startup phase for a phase-locked loop (PLL) circuit, said PLL circuit including a phase comparator and a voltage-controlled oscillator, comprising:
   supplying control pulses by the phase comparator, wherein during each of the control pulses an output signal frequency of the voltage-controlled oscillator increases, wherein said increase comprises applying a pre-charge current at an oscillator input;
   determining at least one time variation of said output signal frequency; and
   adjusting at least one intensity of the pre-charge current depending on said determined at least one time variation so as to cause said determined at least one time variation to approach a reference time variation.

2. The process according to claim 1, wherein adjusting comprises:
   decreasing said at least one intensity if the determined at least one time variation is greater than the reference time variation; and
   increasing said at least one intensity if the determined at least one time variation is less than the reference time variation.

3. The process according to claim 1, further comprising:
   supplying a reference clock signal to the phase comparator of the PLL circuit; and
   supplying a feedback signal to the phase comparator of the PLL circuit, said feedback signal derived from a first counter forming a first divider of an output signal of the voltage-controlled oscillator;
   wherein determining the at least one time variation comprises:
      determining at least two current counting values provided by the first counter respectively upon the occurrence, during a control pulse, of at least two edges belonging to at least two different periods of the reference clock signal; and
      determining said at least one time variation from said at least two current counting values.

4. The process according to claim 3, wherein adjusting comprises:
   decreasing said at least one intensity if the determined at least one time variation is greater than the reference time variation; and
   increasing said at least one intensity if the determined at least one time variation is less than the reference time variation.

5. The process according to claim 1, further comprising:
   supplying a reference clock signal to the phase comparator of the PLL circuit;
   wherein determining said at least one time variation comprises:
      after supplying a first control pulse, performing a first count of a first number of output signal pulses of the voltage-controlled oscillator between two edges belonging to two successive periods of the reference clock signal;
      wherein any increase in the output signal frequency is inhibited during said performing the first count;
      then, after removing the inhibition and after supplying a subsequent second control pulse, performing a second count of a second number of output signal pulses of the voltage-controlled oscillator between two edges belonging to two successive periods of the reference clock signal;
      wherein any increase in the output signal frequency is inhibited during said performing the second count; and
      determining said at least one time variation from the first number and the second number.

6. The process according to claim 5, wherein adjusting comprises:
   decreasing said at least one intensity if the determined at least one time variation is greater than the reference time variation; and
   increasing said at least one intensity if the determined at least one time variation is less than the reference time variation.

7. The process according to claim 1, further comprising:
   supplying a reference clock signal having a duty cycle of 50% to the phase comparator of the PLL circuit;
   resetting, during said start-up phase, a first counter at each first-type edge of the reference clock signal, wherein said first counter forms a first divider of an output signal of the voltage-controlled oscillator;
   supplying a control pulse by the phase comparator at each second-type edge of the reference signal, said phase comparator receiving the reference signal and a feedback signal derived from the first divider; and
   wherein determining said at least one time variation comprises:
      determining at least two current counting values provided by the first counter respectively upon the occurrence of at least two control pulses; and
      determination said at least one time variation from said at least two current counting values.

8. The process according to claim 7, wherein adjusting comprises:
   decreasing said at least one intensity if the determined at least one time variation is greater than the reference time variation; and increasing said at least one intensity if the determined at least one time variation is less than the reference time variation.

9. The process according to claim 1, further comprising, during said start-up phase:
supplying a reference clock signal having a duty cycle of 50% to the phase comparator of the PLL circuit;
resetting a first counter at each first-type edge of the reference clock signal, said first counter forming a first divider of an output signal of the voltage-controlled oscillator;
supplying a control pulse at each second-type edge of the reference signal by the phase comparator, said phase comparator receiving the reference signal and a feedback signal derived from the first divider; and
wherein determining said at least one time variation comprises:
after supplying a first control pulse, performing a first count of a first number of output signal pulses of the voltage-controlled oscillator between two edges of the reference clock signal spaced apart by half a period of the reference clock signal;
after supplying a subsequent second control pulse, performing a second count of a second number of output signal pulses of the voltage-controlled oscillator between two of the reference clock signal spaced apart by half a period of the reference clock signal; and
determining said at least one time variation from the first number and the second number.

10. The process according to claim 9, wherein adjusting comprises:
decreasing said at least one intensity if the determined at least one time variation is greater than the reference time variation; and
increasing said at least one intensity if the determined at least one time variation is less than the reference time variation.

11. The process according to claim 1, further comprising:
applying the pre-charge current to a resistive capacitive filter connected at the oscillator input, wherein the resistive capacitive filter comprises:
a first branch connected between said oscillator input and ground and including a resistive network connected in series with a first capacitor having a first capacitive value, said resistive network including a first resistor connected between said oscillator input and an intermediate node and having a first resistive value and a second resistor connected between the intermediate node and the first capacitor and having a second resistive value; and
a second branch connected between said oscillator input and ground and including a second capacitor having a second capacitive value;
wherein the first capacitive value is equal to a times the second capacitive value, and the first resistive value is equal to a times the second resistive value, and
wherein said pre-charge current is applied to said intermediate node.

12. The process according to claim 1, further comprising:
supplying a feedback signal to the phase comparator of the PLL circuit, said feedback signal derived from a first counter forming a first divider of an output signal of the voltage-controlled oscillator; and
wherein said start-up phase ends when a duration of the control pulse is less than a few percent of a product of an output signal period of the voltage-controlled oscillator and a division ratio of the first divider.

13. The process according to claim 1, further comprising:
supplying a feedback signal to the phase comparator of the PLL circuit, said feedback signal derived from a first counter forming a first divider of an output signal of the voltage-controlled oscillator; and
wherein said start-up phase ends when the phase comparator detects the feedback signal before the reference clock signal.

14. The process according to claim 1, further comprising:
supplying a feedback signal to the phase comparator of the PLL circuit, said feedback signal derived from a first counter forming a first divider of an output signal of the voltage-controlled oscillator; and
wherein said start-up phase ends when a defined duration expires.

15. An integrated circuit, comprising:
a phase-locked loop (PLL) circuit including a voltage-controlled oscillator and a phase comparator configured to supply control pulses during a start-up phase of the PLL circuit;
a control circuit configured, during the start-up phase, to increase an output signal frequency of the voltage-controlled oscillator during each control pulse, said control circuit including a current source whose operation is regulated and activated during each control pulse and configured to apply a pre-charge current at an oscillator input;
a processing circuit configured to perform, during said start-up phase, at least one determination of a time variation of said output signal frequency; and
a regulating circuit configured to regulate, during said start-up phase, said current source to perform at least one adjustment in intensity of the pre-charge current depending on said at least one determined time variation so as to approach a reference time variation.

16. The integrated circuit according to claim 15, wherein the regulating circuit is configured to regulate the current source so as to:
decrease said intensity if the at least one determined time variation is greater than the reference time variation; and
increase said intensity if the at least one determined time variation is less than the reference time variation.

17. The integrated circuit according to claim 15:
wherein the PLL circuit further comprises a first counter forming a first divider of an output signal of the voltage-controlled oscillator; and
further comprising a supply circuit configured to supply the phase comparator of the loop with a reference clock signal, the phase comparator being configured to also receive a feedback signal from the first divider; and
wherein the processing circuit is configured to:
determine at least two current counting values provided by the first counter respectively upon the occurrence, during a control pulse, of at least two edges belonging to at least two different periods of the reference clock signal; and
determine said time variation from said at least two current counting values.

18. The integrated circuit according to claim 17, wherein the regulating circuit is configured to regulate the current source so as to:
decrease said intensity if the at least one determined time variation is greater than the reference time variation; and increase said intensity if the at least one determined time variation is less than the reference time variation.

19. The integrated circuit according to claim 15, further comprising:
a supply circuit configured to supply the phase comparator of the loop with a reference clock signal; and
an inhibition circuit configured to selectively inhibit supply of a control pulse to the control circuit; and
wherein the processing circuit is configured to:
after supplying a first control pulse by the phase comparator, count a first number of output signal pulses of the voltage-controlled oscillator between two edges belonging to two successive periods of the reference clock signal, wherein said inhibition circuit carries out a first inhibition of any supply of control pulses to the control circuit during the count of the first number;
then, after removing the first inhibition and after supplying a subsequent second control pulse by the phase comparator, count of a second number of output signal pulses of the voltage-controlled oscillator between two edges of two successive periods of the reference clock signal, wherein said inhibition circuit carries out a second inhibition of any supply of control pulses to the control circuit during the count of the second number; and
determine said time variation from the first number and the second number.

20. The integrated circuit according to claim 19, wherein the regulating circuit is configured to regulate the current source so as to:
decrease said intensity if the at least one determined time variation is greater than the reference time variation; and
increase said intensity if the at least one determined time variation is less than the reference time variation.

21. The integrated circuit according to claim 15:
wherein the loop further comprises a first counter forming a first divider of an output signal of the voltage-controlled oscillator; and
further comprising:
a supply circuit configured to supply the phase comparator with a reference clock signal having a duty cycle of 50%, the phase comparator being configured to also receive a feedback signal from the first divider; and
a reset circuit configured to perform a reset of the first counter at each first-type edge of the reference clock signal during said start-up phase, the phase comparator being configured to supply a control pulse at each second-type edge of the reference signal; and
wherein the processing circuit is configured to:
determine at least two current counting values provided by the first counter respectively upon the occurrence of at least two control pulses; and
determine said time variation from said at least two current counting values.

22. The integrated circuit according to claim 21, wherein the regulating circuit is configured to regulate the current source so as to:
decrease said intensity if the at least one determined time variation is greater than the reference time variation; and increase said intensity if the at least one determined time variation is less than the reference time variation.

23. The integrated circuit according to claim 15:
wherein the loop further comprises a first counter forming a first divider of an output signal of the voltage-controlled oscillator; and
further comprising:
a supply circuit configured to supply the phase comparator of the loop with a reference clock signal having a duty cycle of 50%, the phase comparator being configured to also receive a feedback signal from the first divider; and
a reset circuit configured to perform during said start-up phase, a reset of the first counter at each first-type edge of the reference clock signal, the phase comparator being configured to supply a control pulse at each second-type edge of the reference signal; and
wherein the processing circuit is configured to:
count, after a control pulse, a first number of output signal pulses of the voltage-controlled oscillator between two edges of the reference clock signal spaced apart by half a period of the reference clock signal;
count, after a subsequent control pulse, a second number of output signal pulses of the voltage-controlled oscillator between two edges of the reference clock signal spaced apart by half a period of the reference clock signal; and
determine said time variation from the first number and the second number.

24. The integrated circuit according to claim 23, wherein the regulating circuit is configured to regulate the current source so as to:
decrease said intensity if the at least one determined time variation is greater than the reference time variation; and
increase said intensity if the at least one determined time variation is less than the reference time variation.

25. The integrated circuit according to claim 15:
wherein the current source is configured to apply, once activated, the pre-charge current in a resistive capacitive filter connected at the oscillator input; and
wherein the resistive capacitive filter comprises:
a first branch connected between said oscillator input and ground and including a resistive network connected in series with a first capacitor having a first capacitive value, said resistive network including a first resistor connected between said oscillator input and an intermediate node and having a first resistive value and a second resistor connected between the intermediate node and the first capacitor and having a second resistive value; and
a second branch connected between said oscillator input and ground and including a second capacitor having a second capacitive value;
wherein the first capacitive value is equal to a times the second capacitive value, and the first resistive value is equal to a times the second resistive value; and
wherein the current source is connected to said intermediate node.

* * * * *